(12) United States Patent
Hosseini et al.

(10) Patent No.: US 9,420,731 B2
(45) Date of Patent: Aug. 16, 2016

(54) ELECTRONIC POWER DEVICE AND METHOD OF FABRICATING AN ELECTRONIC POWER DEVICE

(71) Applicant: Infineon Technologies Austria AG, Villach (AT)

(72) Inventors: Khalil Hosseini, Weihmichl (DE); Joachim Mahler, Regensburg (DE); Ivan Nikitin, Regensburg (DE)

(73) Assignee: Infineon Technologies Austria AG, Villach (AT)

( * ) Notice: Subject to any disclaimer, the term of this patent is extended or adjusted under 35 U.S.C. 154(b) by 251 days.

(21) Appl. No.: 14/030,433

(22) Filed: Sep. 18, 2013

(65) Prior Publication Data
US 2015/0077941 A1    Mar. 19, 2015

(51) Int. Cl.
*H05K 7/20* (2006.01)
*H01L 23/373* (2006.01)
*H01L 23/495* (2006.01)
*H01L 23/498* (2006.01)
*H01L 21/48* (2006.01)

(52) U.S. Cl.
CPC ............ *H05K 7/209* (2013.01); *H01L 21/4875* (2013.01); *H01L 23/3733* (2013.01); *H01L 23/3736* (2013.01); *H01L 21/4871* (2013.01); *H01L 21/4882* (2013.01); *H01L 23/3735* (2013.01); *H01L 23/49562* (2013.01); *H01L 23/49568* (2013.01); *H01L 23/49844* (2013.01); *H01L 2224/06181* (2013.01); *H01L 2224/29111* (2013.01); *H01L 2224/29139* (2013.01); *H01L 2224/29144* (2013.01); *H01L 2224/29147* (2013.01); *H01L 2224/32225* (2013.01); *H01L 2224/32245* (2013.01); *H01L 2224/33181* (2013.01); *H01L 2224/8382* (2013.01); *H01L 2224/8384* (2013.01); *H01L 2224/83851* (2013.01); *H01L 2924/1033* (2013.01); *H01L 2924/10253* (2013.01); *H01L 2924/10272* (2013.01); *H01L 2924/13055* (2013.01); *H01L 2924/13064* (2013.01); *H01L 2924/13091* (2013.01); *Y10T 29/49002* (2015.01); *Y10T 156/10* (2015.01)

(58) Field of Classification Search
None
See application file for complete search history.

(56) References Cited

U.S. PATENT DOCUMENTS

| | | | | |
|---|---|---|---|---|
| 3,999,285 | A * | 12/1976 | Lewis ................. | H01L 21/50 156/306.9 |
| 6,591,897 | B1 * | 7/2003 | Bhatti et al. ................. | 165/80.3 |
| 6,958,912 | B2 * | 10/2005 | Pokharna et al. ............. | 361/700 |
| 2008/0196869 | A1 * | 8/2008 | Behrens et al. ........... | 165/104.33 |
| 2009/0294117 | A1 * | 12/2009 | Hodes et al. .................. | 165/287 |
| 2011/0023927 | A1 * | 2/2011 | Hsu et al. ...................... | 136/205 |
| 2012/0087094 | A1 * | 4/2012 | Hill et al. ...................... | 361/720 |
| 2012/0152454 | A1 * | 6/2012 | Mass et al. .................... | 156/280 |
| 2014/0111956 | A1 * | 4/2014 | Taniguchi ..................... | 361/771 |
| 2014/0261607 | A1 * | 9/2014 | Zhang et al. .................. | 136/205 |

* cited by examiner

*Primary Examiner* — Courtney Smith
(74) *Attorney, Agent, or Firm* — Murphy, Bilak & Homiller, PLLC (57) ABSTRACT

An electronic device comprises a power module comprising a first main surface and a second main surface opposite to the first main surface, wherein at least a portion of the first main surface is configured as a heat dissipating surface without electrical power terminal functionality. The electronic device comprises a porous metal layer arranged on the portion of the first main surface.

12 Claims, 4 Drawing Sheets

ELECTRONIC POWER DEVICE AND METHOD OF FABRICATING AN ELECTRONIC POWER DEVICE

TECHNICAL FIELD

This invention relates to electronic devices containing a power module, and in particular to the technique of heat dissipation of electronic devices.

BACKGROUND

Electronic device manufacturers are constantly striving to increase the performance of their products, while decreasing their cost of manufacture. In the manufacture of electronic devices containing a power module, such as a power semiconductor chip, one area that significantly contributes to cost is packaging of the power module. The performance of an electronic power device is dependent on the heat dissipation capability provided by the package. Packaging methods providing high thermal dissipation and high mechanical robustness at low expenses are desirable in many areas of application.

For these and other reasons, there is a need for improvement.

SUMMARY

According to an embodiment, an electronic device is disclosed. The device includes a power module comprising a first main surface and a second main surface opposite to the first main surface. At least a portion of the first main surface is configured as a heat dissipating surface without electrical power terminal functionality. A first porous metal layer is arranged on the portion of the first main surface.

According to another embodiment, a method of manufacturing an electronic device is disclosed. The method includes providing a power module comprising a first main surface and a second main surface opposite to the first main surface. The first main surface is configured as a heat dissipating surface without electrical power terminal functionality. The method further includes forming a first porous metal layer on the first main surface.

According to an embodiment, a method of mounting an electronic device to a heat sink is disclosed. The electronic device comprises a power module having a first main surface and a second main surface opposite to the first main surface. The first main surface is configured as a heat dissipating surface without electrical power terminal functionality. A first porous metal layer is arranged on the first main surface. The method includes clamping the electronic device to a first heat sink. The first porous metal layer is arranged between the power module and the heat sink. A clamping pressure equal to or more than 50 N/mm$^2$, particularly of equal to or more than 100 N/mm$^2$, is applied.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily drawn to scale relative to each other. Features and/or elements are illustrated with particular dimensions relative to each other primarily for sake of clarity and ease of understanding; as a consequence, relative dimensions in factual implementations may differ substantially from those illustrated herein. In the figures and the description like reference numerals are generally utilized to refer to like elements throughout.

DESCRIPTION OF EMBODIMENTS

In the following detailed description, reference is made to the accompanying drawings, which form a part thereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

As employed in this specification, the terms "coupled" and/or "connected" are not meant to mean in general that elements must be directly coupled or connected together. Intervening elements may be provided between the "coupled" or "connected" elements. However, although not restricted to that meaning, the terms "coupled" and/or "connected" may also be understood to optionally disclose an aspect in which the elements are directly coupled or connected together without intervening elements provided between the "coupled" or "connected" elements.

Electronic devices containing a power module are described herein. The power module may contain one or more power semiconductor chips. In particular, one or more power semiconductor chips having a vertical structure may be involved, that is to say that the power semiconductor chips may be fabricated in such a way that electric currents can flow in a direction perpendicular to the main surfaces of the power semiconductor chips. A power semiconductor chip having a vertical structure has electrodes on its two main surfaces, that is to say on its top side and bottom side. In various other embodiments, horizontal power semiconductor chips may be involved.

The power semiconductor chip(s) may be manufactured from specific semiconductor material such as Si, SiC, SiGe, GaAs, GaN, AlGaN, InGaAs, InAlAs, etc., and, furthermore may contain inorganic and/or organic materials that are not semiconductors. The power semiconductor chip(s) may be of different types and may be manufactured by different technologies.

Power semiconductor chips may, for example, be configured as power MISFETs (Metal Insulator Semiconductor Field Effect Transistors) power MOSFETs (Metal Oxide Semiconductor Field Effect Transistors), IGBTs (Insulated Gate Bipolar Transistors), JFETs (Junction Gate Field Effect Transistors), HEMTs (High Electron Mobility Transistors), power bipolar transistors or power diodes such as a PIN diode or a Schottky diode. By way of example, in vertical devices, the source contact electrode and the gate contact electrode of a power MISFET or a power MOSFET or a HEMT may be situated on one main surface, while the drain contact electrode of the power MISFET or power MOSFET or HEMT may be arranged on the other main surface.

Furthermore, the electronic devices described herein may optionally include one or more logic integrated circuit to control the power semiconductor chip. The logic integrated circuit may include one or more driver circuits to drive the power semiconductor chip. The logic integrated circuit may be a microcontroller including, for example, memory circuits, level shifters, etc.

The power module comprises a first main surface wherein at least a portion of the first main surface is configured as a heat dissipating surface without electrical power terminal functionality. This portion of the first main surface (or the entire first main surface) is insulated from the power terminals of the power module. The portion of the first main surface may itself be of an insulating material such as ceramic. Alternatively, the portion of the first main surface may be of an electrically conducting material such as a metal. In the latter case, the electrically conducting material of the portion of the first main surface is electrically separated (i.e. insulated or disconnected) from any external power terminal of the power module. In particular, the portion of the first main surface does not itself form an electrical power terminal of the power module.

By way of example, the portion of the first main surface may be an exposed surface of a chip carrier on which a power semiconductor chip or multiple power semiconductor chips are mounted. In one embodiment, the chip carrier may be a metal plate or sheet such as a die pad of a leadframe. In this case, the portion of the first main surface may be formed by an insulating layer attached to the back side (i.e. the side opposite to the mounting side) of the leadframe or by an electrically conducting layer separated or insulated from the back side of the leadframe. The metal plate or sheet, e.g. the leadframe, may comprise any metal or metal alloy, e.g., copper or a copper alloy.

In other embodiments, the chip carrier on which the power semiconductor chip is mounted may comprise a plate of ceramic coated with a metal layer, such as a metal bonded ceramic substrate. In this case, the portion of the first main surface may be formed by the ceramic substrate or by an electrically conducting layer (e.g. metal layer) coated on the back side (i.e. the side opposite to the mounting side) of the metal bonded ceramic substrate. In the latter case, the electrically conducting layer is separated or insulated from the power semiconductor chip by the ceramic substrate. By way of example, the chip carrier may be a DCB (direct copper bonded) ceramic substrate.

The power semiconductor chip(s) may at least partly be surrounded or embedded in at least one electrically insulating material. The electrically insulating material may form an encapsulation body of the power module. The encapsulation body may comprise or be made of a mold material. Various techniques may be employed to form the encapsulation body of the mold material, for example compression molding, injection molding, powder molding or liquid molding. Further, the encapsulation body may have the shape of a piece of a layer, such as a piece of a sheet or foil that is laminated on top of the power semiconductor chip(s) and the chip carrier. The encapsulation body may form part of the periphery of the power module, i.e. may at least partly define the shape of the power module. By way of example, the portion of the first main surface may be formed by an exposed chip carrier surface, while at least a part of or the entire remaining portion of the first main surface may be formed by a surface of the encapsulation body.

The electrically insulating material forming the encapsulating body may comprise a thermoset material or a thermoplastic material. A thermoset material may be made on the basis of an epoxy resin. A thermoplastic material may comprise one or more materials of the group of polyetherimide (PEI), polyether-sulfone (PES) polyphenylene-sulfide (PPS) or polyamide-imide (PAI). Thermoplastic materials melt by application of pressure and heat during molding or lamination and (reversibly) harden upon cooling and pressure release.

The electrically insulating material forming the encapsulation body may comprise a polymer material. The electrically insulating material may comprise at least one of a filled or unfilled mold material, a filled or unfilled thermoplastic material, a filled or unfilled thermoset material, a filled or unfilled laminate, a fiber-reinforced laminate, a fiber-reinforced polymer laminate, and a fiber-reinforced polymer laminate with filler particles.

In some embodiments, the electrically insulating material may be a laminate, such as a polymer foil or sheet. Heat and pressure may be applied for a time suitable to attach the polymer foil or sheet to the underlying structure. During lamination, the electrically insulating foil or sheet is capable of flowing (i.e. is in a plastic state), resulting in that gaps between the power semiconductor chips and/or other topological structures on the chip carriers are filled with the polymer material of the electrically insulating foil or sheet. The electrically insulating foil or sheet may comprise or be made of any appropriate thermoplastic or thermoset material. In one embodiment, the insulating foil or sheet may comprise or be made of a prepreg (short for pre-impregnated fibers), that is e.g. made of a combination of a fiber mat, for example glass or carbon fibers, and a resin, for example a thermoset or thermoplastic material. Prepreg materials are known in the art and are typically used to manufacture PCBs (printed circuit boards).

A first porous metal layer is arranged on the portion of the first main surface. The first porous metal layer may be an open celled metal foam layer or a layer composed of metal particles, such as a plasma-deposited particle layer or a sintered metal layer. Porous metal layers provide for a plastic ductility under pressure. If the electronic device is clamped with the first porous metal layer to a first heat sink, the plastic ductility of the first porous metal layer evens out the applied contact pressure and prevents the occurrence of local pressure peaks which otherwise could occur across the first main surface. This property of distributing and absorbing pressure helps to avoid mechanical damage of the power module (in particular if the power module uses ceramic which is prone to mechanical loading). It may also allow application of higher pressure than otherwise. Further, a porous metal layer may have a high thermal conductivity, and the thermal conductivity may even be increased by enhancing the contact pressure. Thus, the porosity of the metal layer may be beneficial both for the mechanical and thermal properties of the electronic device.

A variety of different types of electronic devices may be designed to use one or more porous metal layers for heat dissipation as described herein or may be manufactured by the techniques described herein. By way of example, an electronic device in accordance with the disclosure may constitute a power supply containing two or more power semiconductor chips, e.g. MOSFETs, and one or more logic integrated circuits. For instance, an electronic device disclosed herein may comprise a half-bridge circuit including a high side transistor, a low side transistor and a logic integrated circuit chip. The logic integrated circuit chip may, optionally, include one or a plurality of transistor driver circuitry.

A half-bride circuit as disclosed herein may be implemented in an electronic circuit for converting DC or AC voltages into DC voltages, so-called DC-DC converters and AC-DC converters, respectively. DC-DC converters may be used to convert a DC input voltage provided by a battery or rechargeable battery into a DC output voltage matched to the demands of electronic circuits connected downstream. By way of example, a DC-DC converter described herein may be a buck converter or down-converter. AC-DC converters may be used to convert an AC input voltage provided by, e.g., a high voltage AC power network, into a DC output voltage matched to the demands of electronic circuits connected downstream.

Figure 1:
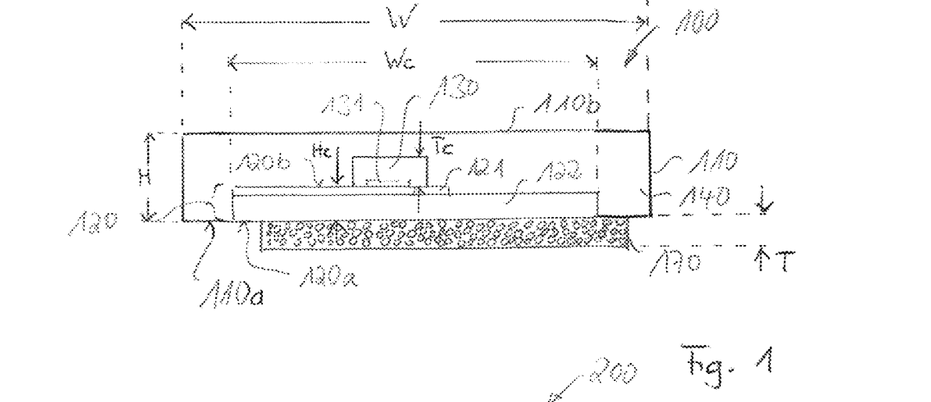
FIG. 1 schematically illustrates a cross-sectional view of an exemplary electronic device comprising a power module.

FIG. 1 illustrates a cross-sectional view of an exemplary electronic device 100. The electronic device 100 may comprise a power module 110 having a first main surface 110a and a second main surface 110b opposite to the first main surface 110a. At least a portion 120a of the first main surface 110a is configured as a heat dissipating surface without electrical power terminal functionality. Further, the electronic device 100 comprises a first porous metal layer 170 arranged on the portion 120a of the first main surface 110a.

The power module 110 may comprise a chip carrier 120 and a power semiconductor chip 130 mounted on an upper surface 120b of the chip carrier 120. By way of example, the upper surface 120b of the chip carrier 120 may be metallic and a bonding layer (not shown) made of, for example, AuSn, AgSn, CuSn, AgIn, AuIn, AuGe, CuIn, AuSi, Sn or Au, may be used to mount the power semiconductor chip 130 to the upper surface 120b of the chip carrier 120. A diffusion solder bond, a soft solder bond, a hard solder bond, a sintered metal bond and/or an electrically conducting adhesive bond may be used to form the bonding layer.

The power semiconductor chip 130 may be of any type, such as a GaN-HEMT, a Si- or SiC-power MOSFET or -power diode. The power semiconductor chip 130 may have high thermal losses during operation, such as a thermal power loss (thermal dissipation) in the range between 1 W and 10 W, or even more. The thermal power generated in the semiconductor power chip 130 during operation must be drained in order to avoid overheating, degradation or breakdown of the power semiconductor chip 130. The power semiconductor chip 130 may be configured to operate at voltages greater than 50 V, 100 V, 300 V, 500 V, or 1000 V. The power semiconductor chip 130 may have a thickness Tc of equal to or less than 300 µm, 200 µm, 100 µm, 80 µm, or 50 µm.

A load power electrode 131 of the power semiconductor chip 130 may be bonded to the chip carrier 120. In this case, the chip carrier 120 may serve as a power conductor and/or external power terminal of the power module 110. In other cases, e.g. if a horizontal power semiconductor chip 130 is used, reference numeral 131 may simply denote a back side metallization of the power semiconductor chip 130 used for securing the power semiconductor chip 130 to the chip carrier 120, but without power current conducting electrical functionality.

A lower surface of the chip carrier 120 may be exposed at the first main surface 110a of the power module 110. The lower surface of the chip carrier 120 may define the portion 120a of the first main surface 110a, which is configured as a heat dissipating surface and on which the porous metal layer 170 is applied. The porous metal layer 170 may be configured to cover the entire lower surface of the chip carrier 120 or a part thereof. The porous metal layer 170 may also be configured to extend laterally beyond the lower surface of the chip carrier 120, see e.g. FIG. 1.

The power semiconductor chip 130 and the chip carrier 120 may be encapsulated in an electrically insulating material, such as a mold material, forming an encapsulation body 140. The encapsulation body 140 may at least partly define the periphery of the power module 110. By way of example, the portion 120a of the first main surface 110a may comprise the exposed lower chip carrier surface, while a residual part of the first main surface 110a of the power module 110 may be formed by the encapsulation body 140. The porous metal layer 170 may be configured to also partly or fully cover the residual part of the first main surface 110a of the power module 110 which may be formed by the encapsulation body 140.

The chip carrier 120 may be of various types. By way of example, as illustrated in FIG. 1, the chip carrier 120 may an upper metal layer 121 and an insulating layer 122. The insulating layer 122 may be a ceramic layer. A chip carrier 120 having a ceramic layer and at least an upper (or lower) metal layer 121 is also referred to herein as a metal bonded ceramic substrate. The portion 120a of the first main surface may be formed by the metal bonded ceramic substrate ("exposed metal bonded ceramic substrate").

In other embodiments, the chip carrier 120 may comprise a leadframe. The portion 120a of the first main surface may be formed by the back side of the metallic leadframe ("exposed leadframe) in the case that the leadframe is not used a power current conductor and/or as an external electrical power terminal of the power module 110. The portion 120a of the first main surface may also be formed by an insulating layer attached to the back side of the leadframe. The insulating layer may be a ceramic layer, such as a boron nitride layer or a calcium oxide layer. In this case, the leadframe may serve as a power current conductor and/or an external electrical power terminal of electronic device 100, and electrical insulation to the first porous metal layer 170 is obtained by the insulating layer.

As known in the art, the maximum load, the performance and the lifetime of a power module 110 critically depend on the operational temperature of the power semiconductor chip 130 contained in the power module 110. For that reason, it is of importance to effectively remove or dissipate the heat generated in the power semiconductor chip 130 during operation.

The first porous metal layer 170 is configured to be clamped to a heat sink (not shown in FIG. 1). When clamped to the heat sink, the first porous metal layer 170 conducts heat generated in the power semiconductor chip 130 to the heat sink. The heat sink may be water cooled or air cooled. In other words, the first porous metal layer 170 is used as a thermal bridge to cool down the power module 110 to temperatures appropriate for proper operation, thermal robustness and lifetime endurance. The first porous metal layer 170 may not be contacted to an external electrical power terminal of the power module 110 and/or may not form an external electrical power terminal of electronic device 100.

By way of example, as illustrated in FIG. 1, the power module 110 may have a lateral dimension or width W in a range between 5-15 mm, and more specifically between 7-13 mm. The power module 110 may have a vertical dimension or height H in a range between, e.g., 0.5-5 mm, more particularly between 1-2 mm. The chip carrier 120 may have a lateral extension Wc greater than 60%, 70%, 80%, 90% of W. The chip carrier 120 may have a vertical dimension Hc in a range between 0.1-1.0 mm, and in particular between, 0.15-0.3 mm. The first porous metal layer 170 may have a thickness T between 20-200 μm, more particularly between 20-100 μm, still more particularly between 30-60 μm.

The first porous metal layer 170 may comprise a metal selected from the group consisting of Cu, Al, Ag, Ni, Mo and alloys thereof.

The first porous metal layer 170 may comprise a porosity between 20-90%, and more particularly between 25-50%. The porosity is the volume of the pores in relation to the total volume of the metal layer.

The first porous metal layer 170 may comprise a thermal conductivity of equal to or greater than 10 W/(mK), and in particular equal to or greater than 15 W/(mK), or 20 W/(mK). Under pressure, i.e. if clamped to a heat sink, the thermal conductivity of the (deformed) porous metal layer 170 may be equal to or greater than 20, 30, 40, or 50 W/(mK).

The description in conjunction with FIG. 1 is applicable to all embodiments of electronic devices described herein. In particular, the quantities set out above are applicable to all other embodiments. Further, the properties of the first porous metal layer 170 as described above also apply to the second porous metal layer which will be described further below.

Figure 2:
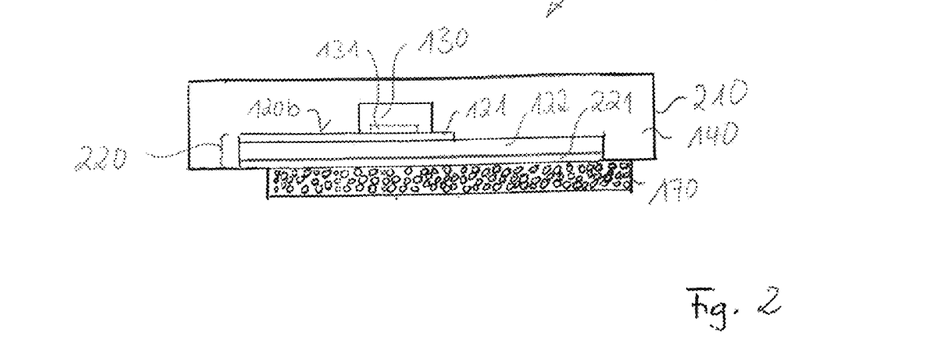
FIG. 2 schematically illustrates a cross-sectional view of an exemplary electronic device comprising a power module.

FIG. 2 illustrates an electronic device 200 having the same configuration as the electronic device 100. However, in the power module 210 of the electronic device 200, the chip carrier 120 is replaced by a chip carrier 220. The chip carrier 220 may comprise the upper metal layer 121 and the insulating layer 122 of chip carrier 120 and, additionally, a lower metal layer 221. By way of example, the chip carrier 220 may be a direct metal bonded ceramic substrate, such as a DCB (direct copper bonded) ceramic substrate.

The lower metal layer 221 of the chip carrier 220 may be exposed at the first main surface 110a of the power module 110 and may define the portion 120a of the first main surface 110a that is configured as a heat dissipating surface and on which the porous metal layer 170 is applied.

As is exemplified in FIGS. 1 and 2, power modules 110, 210 as described herein may have in common an insulating layer (such as the insulating layer 122 or an insulating layer attached to a leadframe as explained above) that extends between the power semiconductor chip 130 and the first porous metal layer 170. This insulating layer, e.g. ceramic layer, may serve to electrically insulate the first porous metal layer 170 from the upper (chip mounting) surface 120b of the chip carrier 120. This insulating layer may have a dielectric strength greater than 100 V, 500 V, 1000 V or even 10 kV. On the other hand, in case the chip carrier 120 is not used as an electrical power current conductor and/or external power terminal of the power module 110, 210, this insulating layer (e.g. insulating layer 122 or insulating leadframe coating layer) may optionally be omitted. By way of example, if the power semiconductor chip 130 is a horizontal device, this insulating layer is not necessarily needed.

Figure 3:
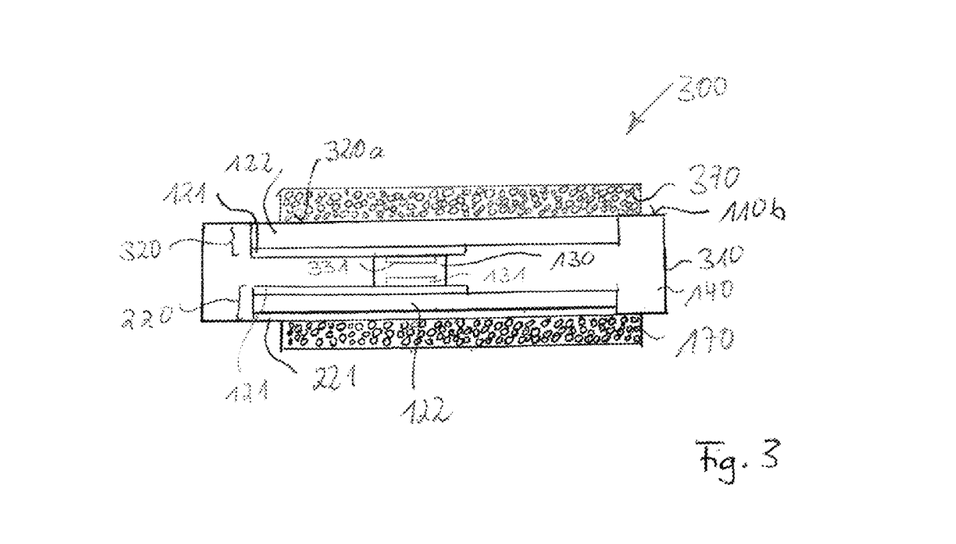
FIG. 3 schematically illustrates a cross-sectional view of an exemplary electronic device comprising a power module having two heat dissipating surfaces.

FIG. 3 illustrates an electronic device 300 having the same configuration as the electronic device 100 or 200 with the exception that the electronic device 300 further comprises another chip carrier 320 exposed at the second main surface 110b of the power module 310 and a second porous metal layer 370 arranged on a portion 320a of the second main surface 110b which is configured as a heat dissipating surface without electrical power terminal functionality. Thus, the power module 310 is sandwiched between the first and second porous metal layers 170, 370 attached to the power module 310 on opposite side. The second porous metal layer 370 may have the same structure, composition, properties, dimensions, functionalities, etc. as the first porous metal layer 170, and reference is made to the description herein to avoid reiteration. In particular, the second porous metal layer 370 may be configured to partly or fully cover a portion of the second main surface 110b of the power module 310 which is configured as a heat dissipating surface without electrical power terminal functionality, and may be configured to partly or fully cover a residual part of the second main surface 110b of the power module 310 which may be formed by the encapsulation body 140.

The chip carrier 320 may have the same structure, composition, properties, dimensions, functionalities, etc. as the chip carrier 120 or the chip carrier 220, and reference is made to the description above to avoid reiteration. In particular, the chip carrier 320 may comprise a metal bonded ceramic substrate or a leadframe coated or not coated by an insulating layer, and the "exposed chip carrier" concept as explained above may be used for defining the portion of the second main surface 110b of the power module 310 which is configured as a heat dissipating surface without electrical power terminal functionality.

The power semiconductor chip 130 may be bonded to the chip carrier 320 the same way and using the same bonding materials as described above in relation to chip carriers 120, 220, and reference is made to the description above to avoid reiteration. In particular, if the power semiconductor chip 130 is a vertical device, a first load power electrode 131 (e.g. drain electrode) of the power semiconductor chip 130 may be bonded to the chip carrier 120 or 220 and a second load power electrode 331 (e.g. source electrode) of the power semiconductor chip 130 may be bonded to the chip carrier 320.

Figure 4:
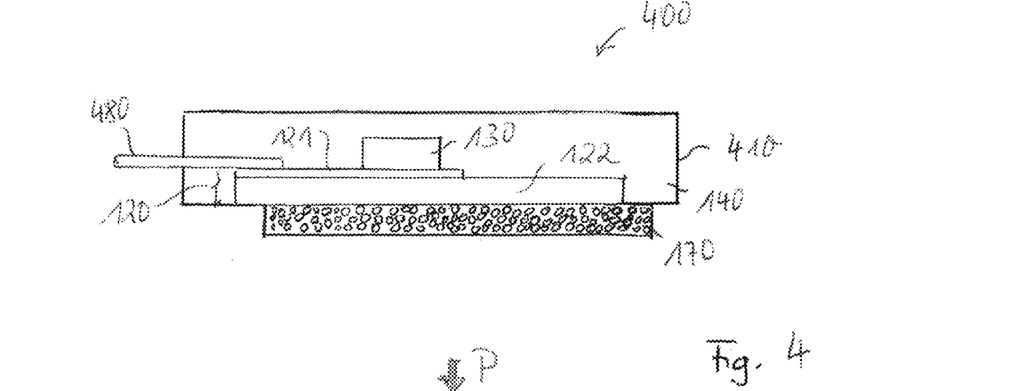
FIG. 4 schematically illustrates a cross-sectional view of an exemplary electronic device comprising a power module, the electronic device having a lateral external power terminal.

FIG. 4 illustrates an electronic device 400 having mostly the same configuration as electronic device 100 or 200. However, FIG. 4 illustrates a first external power (or load) terminal 480 that is electrically coupled to the chip carrier 120 and, more specifically to the upper metal layer 121 of the chip carrier 120. The first external power (or load) terminal 480 may be positioned at a lateral side of the power module 410 which may be formed by the encapsulation body 140 and which may be the same as power modules 110, 210.

Figure 5:
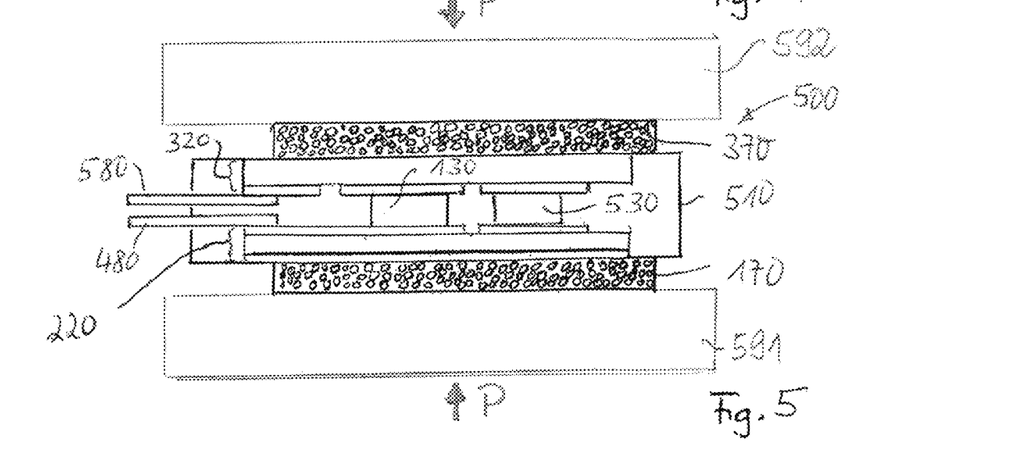
FIG. 5 schematically illustrates a cross-sectional view of an exemplary electronic device comprising a power module, the electronic device having two heat dissipating surfaces and lateral external power terminals.

FIG. 5 illustrates an electronic device 500 having the same configuration as the electronic device 300. However, additional to the first external power (or load) terminal 480 (see FIG. 4), FIG. 5 illustrates a second external power (or load) terminal 580 which is electrically coupled to the chip carrier 320, or, more specifically to the metal layer 121 of the chip carrier 320. The second external power (or load) terminal 580 may be positioned at the same lateral side of the power module 510 as the first external power (or load) terminal 480.

Further, the power module 510 may comprise a plurality of semiconductor chips. For instance, a second power semiconductor chip 530 may be arranged within the power module 510. The second power semiconductor chip 530 may be of the same type as the first power semiconductor chip 130. Further, the second power semiconductor chip 530 may be mounted to the chip carrier 220 and/or the chip carrier 320 the same way as the first power semiconductor chip 130. Reference is made to the above description to avoid reiteration.

Figure 6:
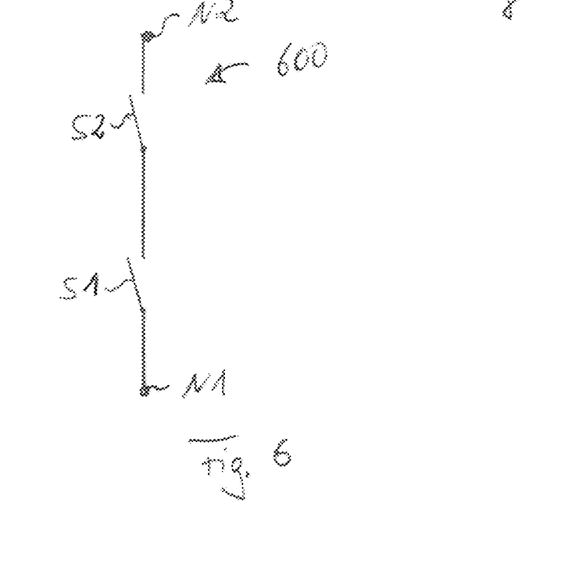
FIG. 6 illustrates a basic circuit diagram of a half-bridge electronic device.

As already mentioned, the electronic devices described herein may, for example, be used as half-bridges. A basic circuit of a half bridge 600 arranged between two nodes N1 and N2 is shown in FIG. 6. The half bridge 600 comprises two switches S1 and S2 connected in series. By way of example, the first power semiconductor chip 130 may be implemented as the high side switch S2 and the second power semiconductor chip 530 may be implemented as the low side switch S1. Then, the node N1 may be the source electrode of the second power semiconductor chip 530 and connected to the second external power terminal 580 and the node N2 may be the drain electrode of the first power semiconductor chip 130 and connected to first external power terminal 480.

Voltages applied between node N1 and node N2 may be equal to or greater than 30 V, 50 V, 100 V, 300 V, 500 V, 1000 V. In particular, voltages applied between nodes N1 and N2 may be in a range of 30-150 V if the electronic device 600 is, for example, a DC-DC converter. Further, if the electronic device 600 is an AC-DC converter, the voltages applied between node N1 and N2 may be in a range between 300-1000 V.

FIG. 5 further illustrates a first heat sink 591 applying pressure P to the first porous metal layer 170 and a second heat sink 592 applying pressure P to the second porous metal layer 370. The pressure P is applied to obtain an effective thermal transport over the heat sink-to-porous metal layer interface by obtaining a full area contact at this interface. To this end, the power electronic device 500 is clamped to the first heat sink 591 whereby the first porous metal layer 170 is arranged between the power module 310 and the first heat sink 501 and a clamping pressure P of equal to or more than 50 N/mm$^2$, particularly of equal to or more than 100 N/mm$^2$ may be applied. Similarly, the second heat sink 592 may exert the same clamping pressure on the second porous metal layer 370.

Due to their intrinsic porosity, the first porous metal layer 170 and/or the second porous metal layer 370 are adapted to act as mechanical cushions to effectively equilibrate and absorb contact pressure peaks. That way, the first and second porous metal layers 170, 370 significantly add mechanical robustness to the electronic devices 100-500. Further, the thermal conductivity of the first and/or second porous metal layers 170, 370 may be about 10 W/(mK) or higher, which is more than the thermal conductivity of a conventional thermal heat sink paste.

Reducing the porosity of the first or second porous metal layers 170, 370 to equal to or less than 50%, 40%, 30%, 25%, 20% increases the thermal conductivity thereof. By way of example, a metal foam type porous metal layer 170, 370 of copper having a porosity of about 20% has a thermal conductivity of more than 50 W/(mK).

Figure 12:
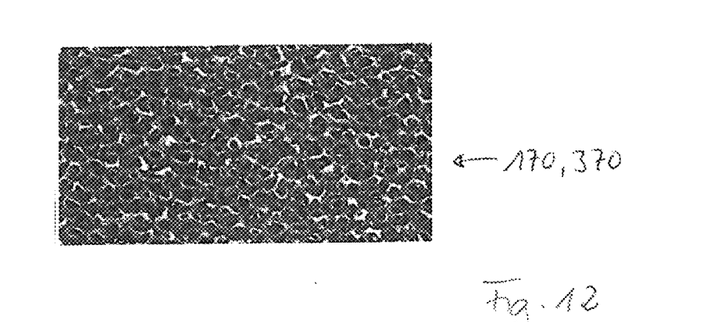
FIG. 12 is a cross-sectional microscope image of a porous metal layer formed by a metal foam.

The porous metal layer 170, 370 described herein may be of various types. One possibility is a porous metal layer 170, 370 of a metal foam type. A metal foam layer has a porous open-celled foam structure consisting of a three-dimensional interconnected network of solid struts formed by an array of similar sized bubbles. By way of example, Duocel® is a conventional metal foam. FIG. 12 is a cross-sectional microscope image of a porous metal foam layer 130, 370.

Figure 10:
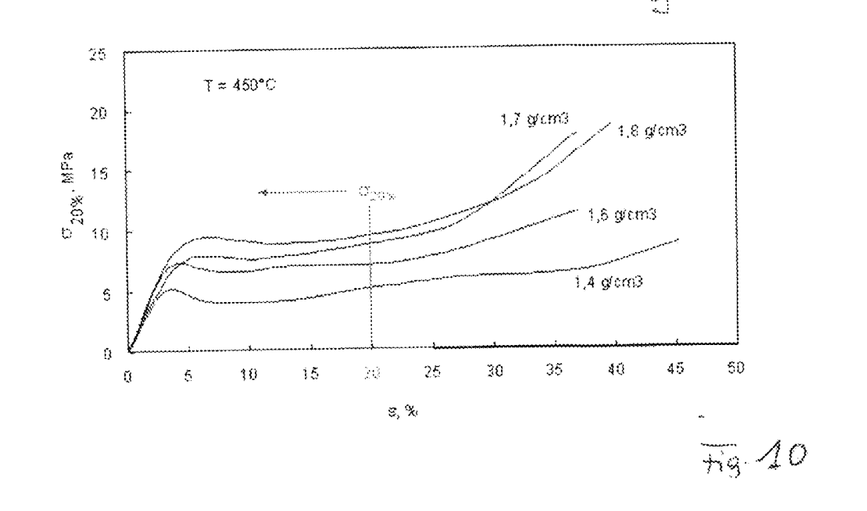
FIG. 10 is a graph illustrating the compressive stress versus strain curve of a metal foam.

When clamping the power module 100-500 at the porous metal layer 170, 370, the porous metal layer 170, 370 may elastically and/or plastically deform to absorb pressure. FIG. 10 is a graph illustrating the compressive stress σ versus strain ∈ curve of a metal foam for the example of an Al metal foam. There is an initial linear region where the material follows σ=E·∈, where E refers to the Young's modulus for compression. The E modulus of the foam may is as low as about 0.7 GPa. At about 5-10 MPa, depending on the density of the metal foam, plastic deformation starts. By compressive deformation, the thermal conductivity of the metal foam layer 170, 370 is increased. Further, the metal foam allows to level all surface irregularities or unevenness in the region of the main surface which is covered by the porous metal layer 170, 370.

Figure 7:
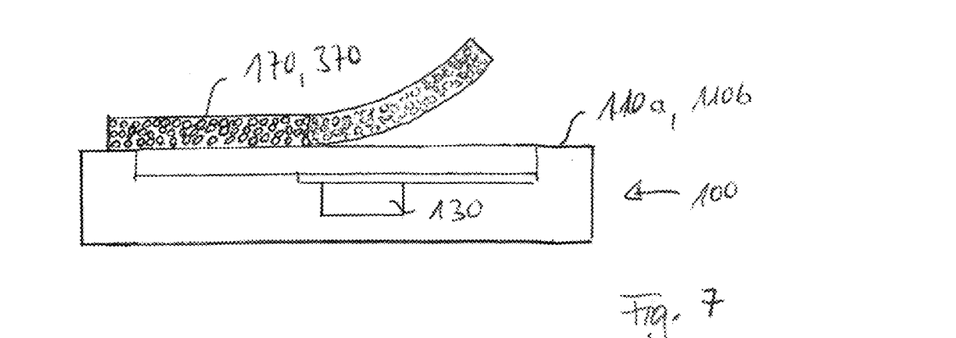
FIG. 7 schematically illustrates an exemplary method of fabricating a porous metal layer by attaching a metal foam layer to a heat dissipating surface of the electronic device.

Referring to FIG. 7, the porous metal layer 170, 370 may be configured as a pre-fabricated foil. In particular, metal foam layers can be provided as in form of a foil. The foil is then fixed to the corresponding main surface 110a, 110b of the power module. Fixing may be performed by laminating, gluing or soldering.

Figure 11:
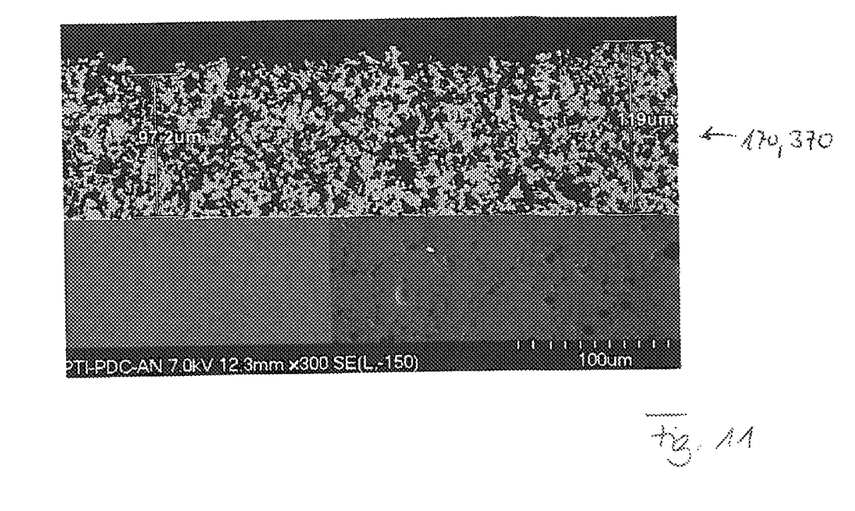
FIG. 11 is a cross-sectional electron microscope image of a porous metal layer formed by a particle deposition technique.

A further type of a porous metal layer 170, 370 as considered herein is a metal particle layer. FIG. 11 is a cross-sectional electron microscope image of a porous metal layer 170, 370 formed by a particle deposition technique. In this example, the porous metal layer 170, 370 may have a thickness between e.g. 97.2 and 119 μm. The mean particle size is about a few microns in FIG. 11 and may, in general, be in a range from, e.g., 1 μm to 20 μm, more particularly in a range from 2 μm to 8 μm. The porosity is about 50% in FIG. 11 and may, in general, be in a range as specified above.

As may be seen from FIG. 11, on a microscopic scale the porous metal layer 170, 370 may be somewhat inhomogeneous. In particular, a few larger voids in the order of magnitude of 10 microns are visible. However, from a macroscopic point of view, the pores are more or less evenly distributed throughout the metal layer 170, 370. Said even distribution may improve the elasticity of the metal layer 170, 370 and may reduce mechanical tension. In any case, the overall mechanical properties of the layer are significantly changed by the porous structure.

The metal particles forming the metal layer 170, 370 may be firmly bonded and may form large scale contiguous areas. Therefore, the thermal properties of such a porous metal layer 170 may be almost as good as those of a solid metal layer of the same dimensions and material.

Figure 8:
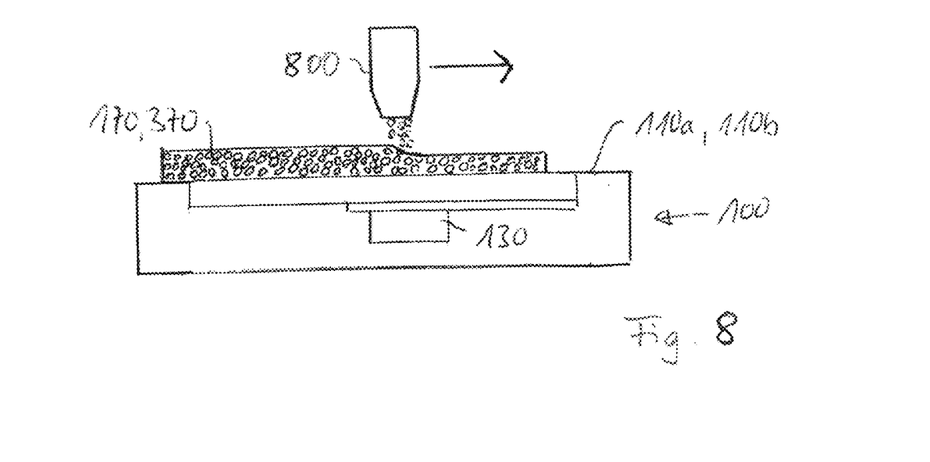
FIG. 8 schematically illustrates an exemplary method of fabricating a porous metal layer by using a particle deposition technique.

FIG. 8 is a cross-sectional view of the exemplary power module 100 during application of the (first) porous metal layer 170 by using a metal particle deposition technique. A dispenser unit 800 may be used for dispensing metal particles over the first main surface 110a or the second main surface 110b. The dispenser unit 800 may be moved laterally over the power module 100 or the power module 100 may be positioned on a movable slide for laterally moving it under the dispenser unit 800. Several sweeps may be needed to form the porous metal layer 170 of a desired thickness.

The dispenser unit 800 may comprise a plasma dispenser. The plasma dispenser may dispense a jet of cold working plasma which may further comprise metal particles in powder form. The working plasma may comprise air or nitrogen or argon or another suitable gas. The plasma gas may further comprise additives, such as hydrogen and/or oxygen. The particles may have a size in a range from 1 µm to 20 µm, and more particularly in a range from 2 µm to 8 µm, and may be continuously fed to the plasma jet. Through the plasma jet the metal particles may be transferred to the portion 120*a* of the first main surface 110*a* (or second main surface 110*b*) which is configured as a heat dissipating surface, and they may adhere to this portion 120*a* to form the porous metal layer 170 (or the porous metal layer 370). As mentioned above, this portion 120*a* may comprise an exposed chip carrier, such as an exposed leadframe or exposed metal bonded ceramic substrate. Metal particles being transferred by the plasma jet of cold working plasma may exhibit a lower velocity compared to other techniques such as plasma spraying or cold gas spraying. The porosity may be tunable through the employed temperature and/or pressure during the cold plasma assisted deposition of particles.

In another embodiment the porous metal layer 170 may be fabricated using other suitable particle deposition techniques like, for example, jet dispersion or flame spraying.

Fabricating a porous metal layer using cold plasma assisted deposition of particles may not require alloy addition like, for example, AuSn, SnAg or CuSn, or addition of flux melting agent which may be necessary when using other methods for fabricating such metal layers but may degrade the thermal or mechanical properties of the metal layer. Furthermore, cold plasma assisted deposition of particles does not entail using organic substances that need to be cleaned off later.

Fabricating a metal layer using cold plasma assisted deposition of microparticles does not require applying interconnection lead between the electronic element and the metal layer. Interconnection lead may degrade the thermal properties of the interconnection and may exhibit only small power cycle stability.

Figure 9:
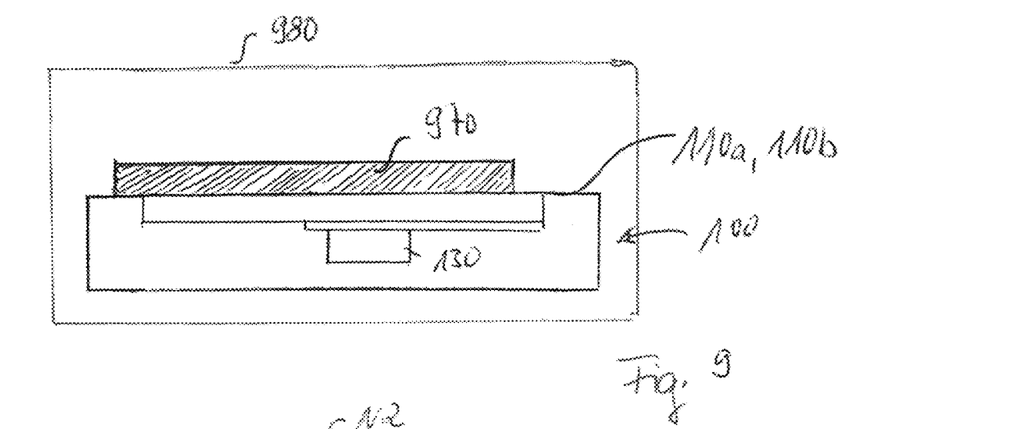
FIG. 9 schematically illustrates an exemplary method of fabricating a porous metal layer by sintering a metal paste attached to a heat dissipating surface of the electronic device.

Another method of fabricating a porous metal layer 170, 370 made of metal particles is low temperature sintering. This method comprises applying a metal paste on the first main surface 110*a* (or second main surface 110*b*), and performing low-temperature sintering of the metal paste.

More specifically, referring to FIG. 9, a paste layer 970 may be formed over the portion 120*a* of the first main surface 110*a* which is configured as a heat dissipating surface. The paste layer may be formed by applying a paste containing metal particles distributed in a polymer material. By way of example, a paste containing silver particles may be used. The paste may be liquid, viscous or waxy. The polymer material may be a resin, such as a b-stage resin, α-terpineol etc. The polymer material may be unfilled, i.e. no filler particles may be included within the polymer material. The sizes (average diameters) of the metal particles may be within the ranges mentioned above.

The application of the paste layer 970 containing the (e.g. different) metal particles dispersed in the liquid, viscous or waxy polymer may be performed by printing technologies, such as stencil printing, screen printing, ink jet printing, etc. Other techniques for the application of the paste, such as foil stripping techniques or dispensing techniques, are also feasible. All these techniques likewise allow for the application of a controllable amount of paste material on the portion 120*a*
of the first main surface 110*a* (or on the corresponding portion of the second main surface 110*b*).

The thickness of the paste layer 970 may be substantially uniform. Otherwise, leveling techniques may be applied in order to provide for a uniform (constant) paste layer 970 thickness.

The paste layer may then be heated up to a low temperature sintering temperature Ts of, for example, 150-250° C. in order to sinter the metal particles. Heating the paste layer 970 may be performed in an oven 980. Sintering causes the paste layer 970 to gain high thermal conductivity and advanced mechanical properties. The application of heat may also cause the polymer material to evaporate from the paste layer 970 on sintering to the porous metal layer 170, 370. As known in the art of sintering, the polymer material may act as an organic burnout material, which may have an effect on the structure (e.g. porosity, mean pore volume, pore density) of the porous metal layer 170, 370. The porous metal layer 170, 370 may thus be composed of sintered metal particles and of voids formed in the spaces between the sintered metal particles.

External pressure may optionally be applied during the application of heat. Even if external pressure is applied, the granular, particle-type structure of the porous metal layer 170, 370 is maintained. However, the application of pressure may increase the density and/or reduce the porosity or the porous metal layer 170, 370.

Irrespective of the type the porous metal layer 170, 370 (e.g. particle-type or foam-type) and the method of formation, the porous metal layer 170, 370 may additionally be filled with a material which increases the thermal conductivity of the porous metal layer 170, 370. By way of example, a thermal heat sink paste could be used as a filler material. The thermal heat sink paste may be liquid or waxy and may be applied by dispensing, spraying, immersing the porous metal layer 170, 370 into the liquid, etc. The heat sink paste may be metal-based, containing silver or aluminum powder, ceramic-based, containing silicon dioxide, zinc oxide, aluminum oxide, aluminum nitride, beryllium oxide, or carbon-based. It is also possible to use pressure in order to force the thermal heat sink paste into the pores of the porous metal layer 170, 370. Further, the porous metal layer 170, 370 (e.g. particle-type or foam-type) may be (partially) filled with a metal such as, e.g., Cu, Al, Ag, Ni, Mo and alloys thereof by galvanic deposition (galvanic filling) in order to increase the thermal conductivity. The galvanic deposition may be performed after the application of the porous layer 170, 370 to the power module.

Further, the porous metal layer 170, 370 may be fabricated separately from the power module 100-500 by using a separate layer carrier or, for example, in case of a metal foam, without using any layer carrier. The porous metal layers 170, 370 may then be delivered to the customer separately from the power modules. The customer may then apply these porous metal layers 170, 370 as cushions to the power modules 100-500 before clamping the power modules 100-500 to the heat sink(s).

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An electronic device, comprising:
a power module comprising a first main surface and a second main surface opposite to the first main surface, wherein at least a portion of the first main surface is a heat dissipating surface without electrical power terminal functionality;
a first porous metal layer arranged on the portion of the first main surface;
a chip carrier; and
a power semiconductor chip mounted on the chip carrier, wherein the chip carrier is exposed at the portion of the first main surface of the power module,
wherein the chip carrier comprises a metal bonded ceramic substrate or a leadframe.

2. electronic device of claim 1, further comprising:
a second porous metal layer arranged on a portion of the second main surface, wherein at least the portion of the second main surface is a heat dissipating surface without electrical power terminal functionality.

3. The electronic device of claim 1, wherein the first porous metal layer comprises a metal selected from the group consisting of Cu, Al, Ag, Ni. Mo and alloys thereof.

4. The electronic device of claim 1, wherein the first porous metal layer comprises a thickness in a range from 20 µm to 200 µm.

5. The electronic device of claim 1, wherein the first porous metal layer comprises a porosity in a range from 20% to 90%.

6. The electronic device of claim 1, wherein the first porous metal layer comprises a thermal conductivity of equal to or greater than 10 W/(mK).

7. The electronic device of claim 1, wherein the first porous metal layer is an open-celled metal foam layer.

8. The electronic device of claim 1, wherein the first porous metal layer is a particle layer comprising particles having a mean particle size in a range from 1 µm to 20 µm.

9. The electronic device of claim 1, wherein the first porous metal layer is configured to deform when the electronic device is clamped with the first porous metal layer t0 a first heat sink.

10. The electronic device of claim 1, further comprising:
an insulating layer extending between the power semiconductor chip and the first porous metal layer.

11. The electronic device of claim 1, further comprising:
a second chip carrier exposed at the second main surface of the power module.

12. An electronic device, comprising:
a power module comprising a first main surface and a second main surface opposite to the first main surface, wherein at least a portion of the first main surface is a heat dissipating surface without electrical power terminal functionality;
a first porous metal layer arranged on the portion of the first main surface; and
a second porous metal layer arranged on a portion of the second main surface,
wherein at least the portion of the second main surface is a heat dissipating surface without electrical power terminal functionality, and
wherein the first and second metal porous layers are completely separated from one another.

* * * * *